United States Patent

Garrigus

[15] 3,639,779

[45] Feb. 1, 1972

[54] LIMITER CIRCUIT WITH ENABLE FUNCTION

[72] Inventor: Kenneth A. Garrigus, Foxboro, Mass.

[73] Assignee: G. T. E. Sylvania Incorporated

[22] Filed: Mar. 15, 1971

[21] Appl. No.: 124,241

[52] U.S. Cl. ....................307/237, 307/235, 307/261, 328/169

[51] Int. Cl. ....................H03k 5/08

[58] Field of Search ....................307/235, 237, 261; 328/13, 328/31, 168, 169

[56] References Cited

UNITED STATES PATENTS 3,579,125 5/1971 Lindblad....................307/235 X

OTHER PUBLICATIONS

Electronics December 23, 1968 pg. 59 " Two IC Comparators Improve Threshold Converter" by G. S. Oshiro

*Primary Examiner*—John Zazworsky

*Attorney*—Norman J. O'Malley, Elmer J. Nealon and David M. Keay

[57] ABSTRACT

A limiter circuit employing two high-gain differential voltage comparators. A positive reference voltage is established at the noninverting input of one comparator and a reference voltage of ground is established at the inverting input of the other. Input signals are applied at the inverting input of the one comparator and at the noninverting input of the other. The output of the one comparator is connected to an input of a flip-flop composed of two cross-connected NAND gates. The output of the other comparator is connected through an inverter circuit and a triggering circuit to another input of the flip-flop. The output of the flip-flop and the output of the inverter circuit are connected to an output NAND gate. The flip-flop is set by the action of the one comparator when a positive-going input signal exceeds the threshold of the positive reference voltage, thus enabling the output NAND gate. Subsequent passing of the negative-going input signal through the zero voltage threshold causes the output NAND gate to switch producing a square-wave output. This negative-going signal also causes the triggering circuit to reset the flip-flop.

7 Claims, 2 Drawing Figures

INVENTOR
Kenneth A. Garrigus
By David M. Kay
Agent

INVENTOR

Kenneth A. Garrigus

By David M. Keay

Agent

LIMITER CIRCUIT WITH ENABLE FUNCTION

BACKGROUND OF THE INVENTION

This invention relates to limiter circuits. More particularly, it is concerned with circuits for producing a square wave of definite amplitude in response to input signals above a threshold.

High-gain amplifiers which clip the output signal at a desired level have been employed as limiter circuits. However, with limiters of this type the output signal has the same relative shape as the input signal below the clipping voltage and thus the rise and fall times of the output depend on the magnitude of the input and the gain of the amplifier. Another form of limiter circuit is standard Schmitt trigger circuit. However, there is a loss of symmetry in the output signal of a Schmitt trigger circuit which depends on the level at which the threshold is set.

SUMMARY OF THE INVENTION

An improved limiter circuit in accordance with the invention is enabled by the input signal exceeding a threshold so as to permit generation of a square wave output signal with the subsequent passing of the input signal through a second threshold. The limiter circuit includes first and second differential amplifiers, each of which has first and second input terminals and an output terminal. Each differential amplifier produces a first output condition at its output terminal in response to a voltage differential of one polarity between its first and second input terminals, and produces a second output condition at its output terminal in response to a voltage differential of the opposite polarity between its first and second input terminals.

The circuit includes a first voltage reference means which is connected to the first input terminal of the first differential amplifier and provides a first reference voltage of the one polarity at that terminal. A second voltage reference means is connected to the second input terminal of the second differential amplifier to provide a second reference voltage at that terminal. The second reference voltage is of the opposite polarity with respect to the first reference voltage. The second input terminal of the first differential amplifier and the first input terminal of the second differential amplifier are both connected to a signal input terminal.

The limiter circuit includes a bistable circuit means having a first operating state during which a first output condition is produced at its output terminal and having a second operating state during which a second output condition is produced at its output terminal. The bistable circuit means is connected to the output terminal of the first differential amplifier. The bistable circuit means switches from the second operating state to the first operating state in response to the output condition at the output terminal of the first differential amplifier changing from the first condition to the second condition.

A triggering means is coupled to the output terminal of the second differential amplifier and to the bistable circuit means. The triggering means causes the bistable circuit means to switch from the first operating state to the second operating state in response to the output condition at the output terminal of the second differential amplifier changing from the second condition to the first condition.

An output means is coupled to the output terminal of the bistable circuit means and to the output terminal of the second differential amplifier. The output means produces a first output condition at its output terminal when the first condition is present at the output terminal of the second differential amplifier, and produces a second output condition at the output terminal when the second condition is present at the output terminal of the second differential amplifier and the bistable circuit means is in the first operating state.

Thus, when an increasing voltage of the one polarity at the signal input terminal exceeds the first reference voltage, the bistable circuit means switches to the first operating state. Subsequently, when the voltage at the signal input terminal becomes of the opposite polarity with respect to the second reference voltage, the second output condition is produced at the output terminal of the output means. That is, the limiter circuit is enabled by the input signal exceeding the first reference voltage so that subsequently when the input signal passes through the voltage of the second reference voltage, the output condition of the circuit is changed.

BRIEF DESCRIPTION OF THE DRAWINGS

Additional objects, features, and advantages of limiter circuits in accordance with the present invention will be apparent from the following detailed discussion together with the accompanying drawings wherein.

DETAILED DESCRIPTION OF THE INVENTION

Figure 1:
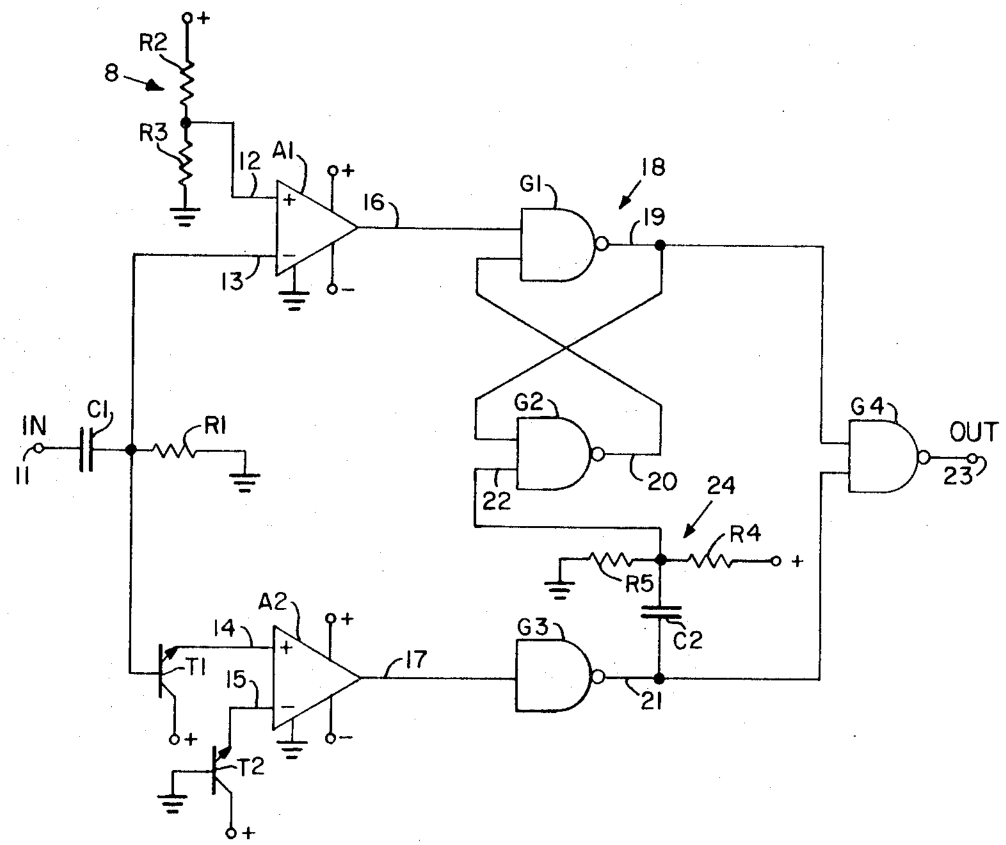
FIG. 1 is a schematic circuit diagram of a limiter circuit in accordance with the invention.

The limiter circuit in accordance with the invention as illustrated in FIG. 1 includes two differential amplifiers A1 and A2. Each amplifier A1 and A2 has a noninverting input terminal 12 and 14, an inverting input terminal 13 and 15, and an output terminal 16 and 17, respectively, plus terminals for applying operating voltages. The amplifiers operate in a known manner to produce a relatively high output voltage level at the output terminal when the voltage level at the noninverting input terminal is more positive than the voltage at the inverting input terminal, and to produce a relatively low output voltage level, near ground, when the voltage level at the inverting input terminal is more positive than the voltage level at the noninverting input terminal.

A positive reference voltage is produced at the noninverting input terminal 12 of the first differential amplifier A1 by a voltage reference network 8 including a pair of resistances R2 and R3 connected in series as a voltage divider between a positive source of voltage and ground. The input terminal 12 is connected to the juncture of the two resistances R2 and R3. The inverting input terminal 15 of the second differential amplifier A2 is connected to ground through the emitter-base junction of an NPN-transistor T2. The collector of the transistor T2 is connected to a source of positive voltage.

The input terminal 11 of the limiter circuit is connected through a coupling capacitor C1 and a resistance R1, which serves as a load resistance for the preceding stage, to ground. The juncture of the capacitor C1 and resistance R1 is connected directly to the inverting input terminal 13 of the first differential amplifier A1. The juncture is also connected to the base of an NPN-transistor T1 which has its collector connected to a positive source of voltage and its emitter connected directly to the noninverting input terminal 14 of the second differential amplifier A2.

The transistor T1 is included in the input path from the input terminal 11 to the second differential amplifier A2 in order to reduce the effects of input bias current on the amplifier during low level signals. Transistor T2 is included in the path between ground and the second differential amplifier A2 in order to balance the transistor T1 in the path to the other input terminal.

The output terminal 16 of the first differential amplifier A1 is connected to a bistable circuit 18. The bistable circuit is a flip-flop formed of two cross-coupled NAND-gates G1 and G2. The first NAND-gate G1 has two inputs with the first connected to the output terminal 16 of the first differential amplifier A1 and the second connected to the output 20 of the second NAND-gate G2. The second NAND-gate G2 has one input 22 connected to a triggering circuit 24 and another input connected to the output 19 of the first NAND-gate G1.

The output terminal 17 of the second differential amplifier A2 is connected to the input of a NAND-gate inverter circuit G3, which is controlled by a single input. The output 21 of the inverter circuit G3 is connected to the first input 22 of the second NANDegate G2 of the bistable circuit 18 through the triggering circuit 24. The triggering circuit 24 includes two resistances R4 and R5 connected in series between a source of positive voltage and ground. A capacitor C2 is connected between the output 21 of the inverter circuit G3 and the juncture of the two resistances R4 and R5. The juncture of the two resistances is also connected directly to first input terminal 22 of the NAND-gate G2. The triggering means 24 serves to maintain a relatively high input voltage at the input terminal 22 of the NAND-gate G2 except when the output of the inverter circuit G3 changes from a relatively high-voltage level to a low-voltage level. This action produces a negative-going pulse at the input terminal 22 of the NAND-gate G2.

The output 19 of the first NAND-gate G1 of the bistable circuit 18 is connected to one input of a NAND output gate G4. The output 21 of the inverter circuit G3 is connected to a second input of the output NAND-gate G4. The output of the NAND-gate G4 is connected directly to the output terminal 23 of the circuit.

Figure 2:
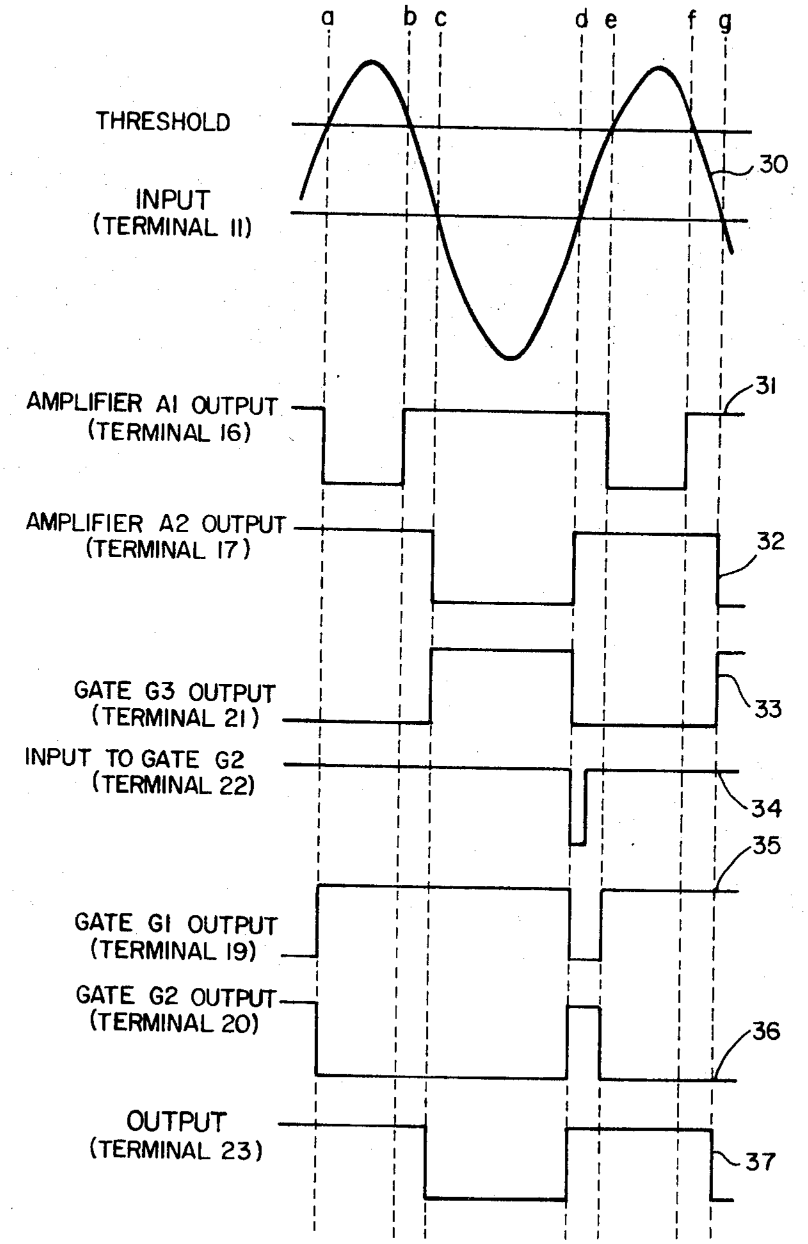
FIG. 2 is a set of curves illustrating voltage conditions at various points throughout the circuit of FIG. 1 during operation of the circuit.

Operation of the circuit of FIG. 1 may best be understood by reference to the voltage curves of FIG. 2. Curve 30 illustrates a sinusoidal input signal applied at the input terminal 11, curves 31 and 32 show the relative voltage level conditions at output terminals 16 and 17 of the differential amplifiers A1 and A2, respectively, curve 33 shows the relative voltage level conditions at the output 21 of the inverter circuit G3, curve 34 shows the input voltage conditions at the input terminal 22 to the second NAND-gate G2 of the bistable circuit 18, curves 35 and 36 illustrate the relative voltage level conditions at the output terminals 19 and 20 of the NAND-gates G1 and G2, respectively, of the bistable circuit 18, and curve 37 shows the voltage level at the output terminal 23 of the circuit.

During a positive-going portion of the input signal 30 immediately after the signal level exceeds ground, the voltage conditions throughout the circuit are as shown at the start of curves 31 through 37 of FIG. 2. The voltages at the noninverting input terminals 12 and 14 of the two differential amplifiers A1 and A2 are more positive than the voltages at the inverting input terminals 13 and 15, and therefore the output conditions at the amplifier output terminals 16 and 17 are relatively high (curves 31 and 32). The voltage at the output 21 of the inverter circuit G3 is relatively low (curve 33), and the input 22 to the NAND-gate G2 is biased at the normally high-voltage level by the triggering circuit 24 (curve 34). Under these conditions the bistable circuit 18 is in its second operating state with the output voltage at the output 19 of the first NAND-gate G1 relatively low (curve 35), and with the output voltage at the output 20 of the second NAND-gate G2 relatively high (curve 36). Since both inputs to the output NAND-gate G4 are relatively low, the voltage at the output terminal 23 is relatively high (curve 37).

When the input signal 30 reaches the threshold level set by the voltage reference network 8 (point *a*), the voltage at the noninverting input 12 of the first differential amplifier A1 becomes less than that at the inverting input 13 and the output voltage of the amplifier A1 drops to a low level (curve 31). This change at its input causes NAND-gate G1 to switch operating conditions which in turn causes NAND-gate G2 to change operating conditions. The voltage level at the output 19 of NAND-gate G1 rises and that at output 20 of NAND-gate G2 drops (curves 35 and 36). Since the input to the output NAND-gate G4 from the inverter circuit G3 remains low, the output of the circuit remains relatively high (curve 37).

After the input signal peaks and then drops in voltage below the threshold level (point *b* ), the noninverting input 12 of the first differential amplifier A1 becomes more positive than the inverting input 13 and the output at its output terminal 16 again becomes high (curve 31). However, this situation does not change the operating conditions of the NAND-gates G1 and G2 of the bistable circuit 18, and conditions elsewhere in the circuit also remain the same.

When the input signal 30 goes negative passing through zero voltage (point *c* ), the voltage level at the noninverting input terminal 14 of the second differential amplifier A2 becomes negative with respect to ground and the voltage level at the output 17 of the second differential amplifier A2 becomes low (curve 32). Consequently the voltage at the output 21 of the inverter circuit G3 becomes high (curve 33). Since the output 19 of NAND-gate G1 of the bistable circuit 18 has previously been set to a high level by the input signal exceeding the threshold level, when the output 21 of the inverter circuit G3 becomes high, the output NAND-gate G4 switches to produce the relatively low voltage at the output terminal 23 of the circuit (curve 37).

During the negative half cycle of the input signal 30, there is no change in the conditions throughout the circuit. When the positive-going input signal 30 passes through zero voltage (point *d* ), the voltage level at the noninverting input 14 of the second differential amplifier A2 becomes positive with respect to the voltage at the inverting input 15. The second differential amplifier switches to produce a relatively high-voltage level at its output terminal 17 (curve 32). This signal is inverted by the inverter circuit G3, producing a low-voltage level at its output 21 (curve 33) thereby causing the output NAND-gate G4 to switch and produce a high voltage at the output terminal 23 of the circuit (curve 37).

In addition, when the voltage at the output of the inverter circuit G3 changes from the relatively low-voltage level, the triggering circuit 24 momentarily produces a relatively low voltage at the input 22 to NAND-gate G2 of the bistable circuit 18 in place of the normal relatively high biasing voltage (curve 34). The negative-going pulse applied to the input 22 of NAND-gate G2 causes that gate to change operating conditions producing a relatively high voltage at its output 20 (curve 36). Since A1 is producing a relatively high voltage at its output terminal 16 (curve 31), NAND-gate G1 changes operating conditions and the voltage at its output 19 becomes relatively low (curve 35). This voltage applied at the input of NAND-gate G2 causes NAND-gate G2 to remain in its new operating condition upon termination of the triggering pulse from the triggering circuit 24, and the bistable circuit 18 is reset.

Conditions in the circuit are thus restored to those conditions as shown at the start of the curves of FIG. 2. During subsequent cycles of the input signal the operation of the limiter circuit is repeated in the manner described as indicated at points *e*, *f*, and *g* of the curves in FIG. 2 producing a square wave output signal.

Thus, as explained in the foregoing discussion, the passing of the positive-going input signal through the threshold voltage, established by the voltage reference network 8, causes the first differential amplifier A1 to set the bistable circuit 18, thus enabling the circuit so that subsequent passing of the negative-going input signal through the zero voltage threshold, established by the ground connection of the second input terminal 15 of the second differential amplifier A2, triggers a change in the output of the circuit. If the peak input voltage during a positive half cycle of the input signal does not reach the threshold voltage, the output voltage of the first differential amplifier A1 remains high and the bistable circuit 18 is not set. Thus, the voltage at the output 19 of NAND-gate G1 remains low so that the output NAND-gate G4 is prevented from being switched by subsequent actions affecting the second differential amplifier A2 and the inverter gate G3, and the output of the circuit remains high during the negative half cycle of the input signal.

A limiter circuit in accordance with FIG. 1 may be fabricated employing the particular components as listed below.

| | |
|---|---|
| A1, A2 | 710 Differential Comparator |
| T1, T2 | CA3045 transistors |
| G1, G2, G3, G4 | SG-143 NAND gates |
| R1 | 1 KΩ |
| R2 | 24.2 kΩ |
| R3 | 301 Ω |

| | |
|---|---|
| R4 | 4.7 kΩ |
| R5 | 4.7 KΩ |
| C1 | 4.7 μf. |
| C2 | 100 pf. |
| Voltage at + terminal of voltage reference network 8 | +12 volts |
| Voltage at + terminal of trigger circuit 24 | +5 volts |

While there has been shown and described what is considered a preferred embodiment of the present invention, it will be obvious to those skilled in the art that various changes and modifications may be made therein without departing from the invention as defined in the appended claims.

What is claimed is:

1. A limiter circuit including in combination a first differential amplifier having first and second input terminals and an output terminal, said first differential amplifier being operable to provide a first output condition at the output terminal in response to a voltage differential of one polarity between the first and second input terminals and being operable to produce a second output condition at the output terminal in response to a voltage differential of the opposite polarity between the first and second input terminals;

a second differential amplifier having first and second input terminals and an output terminal, said second differential amplifier being operable to provide a first output condition at the output terminal in response to a voltage differential of one polarity between the first and second input terminals and being operable to produce a second output condition at the output terminal in response to a voltage differential of the opposite polarity between the first and second input terminals;

first voltage reference means connected to the first input terminal of the first differential amplifier for providing a first reference voltage of the one polarity at said terminal;

second voltage reference means connected to the second input terminal of the second differential amplifier for providing a second reference voltage at said terminal, said second reference voltage being of the opposite polarity with respect to said first reference voltage;

a signal input terminal connected to the second input terminal of the first differential amplifier and the first input terminal of the second differential amplifier;

bistable circuit means having a first operating state during which a first output condition is produced at its output terminal and a second operating state during which a second output condition is produced at its output terminal, said bistable circuit means being connected to the output terminal of the first differential amplifier and being operable to switch from the second operating state to the first operating state in response to the output condition at the output terminal of the first differential amplifier changing from the first condition to the second condition;

triggering means coupled to the output terminal of the second differential amplifier and to the bistable circuit means and operable to switch the bistable circuit means from the first operating state to the second operating state in response to the output condition at the output terminal of the second differential amplifier changing from the second condition to the first condition; and output means coupled to the output terminal of the bistable circuit means and the output terminal of the second differential amplifier and having an output terminal, said output means being operable to produce a first output condition at the output terminal when the first condition is present at the output terminal of the second differential amplifier and being operable to produce a second output condition at the output terminal when the second condition is present at the output terminal of the second differential amplifier and the bistable circuit means is in the first operating state;

whereby when an increasing voltage of the one polarity at the signal input terminal exceeds the first reference voltage, the bistable circuit means switches to the first operating state and subsequently when the voltage at the signal input terminal becomes of the opposite polarity with respect to the second reference voltage, the second output condition is produced at the output terminal of the output means.

2. A limiter circuit in accordance with claim 1 wherein said bistable circuit means includes a first NAND gate having an output connection, a first input connection connected to the output terminal of the first differential amplifier, and a second input connection, said first NAND gate having a first operating condition during which a first condition is produced at its output connection and a second operating condition during which a second condition is produced at its output connection;

a second NAND gate having an output connection connected to the second input connection of the first NAND gate, a first input connection connected to said triggering means, and a second input connection connected to the output connection of the first NAND gate, said second NAND gate having a first operating condition during which a first condition is produced at its output connection and a second operating condition during which a second condition is produced at its output connection;

said triggering means being operable normally to produce a first condition at the first input connection of the second NAND gate and being operable momentarily to produce a second condition at the first input connection of the second NAND gate in response to the output condition at the output terminal of the second differential amplifier changing from the second condition to the first condition;

said first NAND gate being operable in the second operating condition only when the first output condition of the first differential amplifier is present at the first input connection thereto and the first condition of the second NAND gate is present at the second input connection thereto;

said second NAND gate being operable in the second operating condition only when the first output condition of the triggering means is present at the first input connection thereto and the first condition of the first NAND gate is present at the second input connection thereto;

whereby said bistable circuit means is in the first operating state when the first NAND gate is in the first operating condition and the second NAND gate is in the second operating condition, and the bistable circuit means is in the second operating state when the first NAND gate is in the second operating condition and the second NAND gate is in the first operating condition.

3. A limiter circuit in accordance with claim 2 wherein said first voltage reference means includes two resistances connected in series between a source of reference voltage of the one polarity and ground;

the first input terminal of the first differential amplifier is connected to the juncture of the two resistances of the first voltage reference means; and said second voltage reference means includes ground.

4. A limiter circuit in accordance with claim 3 wherein the reference voltage of the one polarity established at the first input terminal of the first differential amplifier by the first voltage reference means causes the output condition of the first differential amplifier to be changed when a voltage of the one polarity of predetermined value is present at the signal input terminal; and the reference voltage established at the second input terminal of the second differential amplifier by the second voltage reference means causes the output condition of the second differential amplifier to be changed when a zero value voltage is present at the signal input terminal.

5. A limiter circuit in accordance with claim 4 including an inverter circuit having its input connected to the output terminal of the second differential amplifier and operable to produce a first condition at its output when the second output condition is present at the output terminal of the second differential amplifier and operable to produce a second condition at its output when the first output condition is present at the output terminal of the second differential amplifier;

and wherein the output means includes a NAND gate having a first input connected to the output of the first NAND gate of the bistable circuit means, a second input connected to the output of the inverter circuit, and an output connected to the output terminal of the output means; said NAND gate being operable to produce the first output condition at the output terminal of the output means when the second condition is present at the output of the first NAND gate or when the second condition is present at the output of the inverter circuit, and being operable to produce the second condition at the output terminal of the output means when the first condition is present at the output of the first NAND gate and the first condition is present at the output of the inverter circuit.

6. A limiter circuit in accordance with claim 5 wherein said one polarity is positive with respect to ground and said opposite polarity is negative with respect to ground;

said first output condition at the output terminal of the first differential amplifier is a relatively high-voltage level with respect to ground and the second output condition at the output terminal of the first differential amplifier is a relatively low-voltage level with respect to ground;

said first output condition at the output terminal of the second differential amplifier is a relatively high-voltage level with respect to ground and the second output condition at the output terminal of the second differential amplifier is a relatively low-voltage level with respect to ground;

said first condition at the output connection of the first NAND gate of the bistable circuit means is a relatively high-voltage level with respect to ground and the second condition at the output connection of the first NAND gate of the bistable circuit means is a relatively low-voltage level with respect to ground;

said first condition at the output connection of the second NAND gate of the bistable circuit means is a relatively voltage level with respect to ground and the second condition at the output connection of the second NAND gate of the bistable circuit means is a relatively low-voltage level with respect to ground;

said first condition at the output of the inverter circuit is a relatively high-voltage level with respect to ground and the second condition at the output of the inverter circuit is a relatively low-voltage level with respect to ground; and said first condition at the output of the NAND gate of the output means is a relatively high-voltage level with respect to ground and the second condition at the output of the NAND gate of the output means is a relatively low-voltage level with respect to ground.

7. A limiter circuit in accordance with claim 6 wherein said first and second differential amplifiers are each differential voltage comparators with the first input terminals being noninverting input terminals and the second input terminals being inverting input terminals.

* * * * *